CAPACITOR SOAKAGE COMPENSATION

Filed March 27, 1967

INVENTOR.
CHARLES H. SINGLE

BY Richard D. Stephens

ATTORNEY

United States Patent Office 3,529,245

Patented Sept. 15, 1970

3,529,245

CAPACITOR SOAKAGE COMPENSATION

Charles H. Single, Ann Arbor, Mich., assignor to Applied Dynamics, Inc., Ann Arbor, Mich., a corporation of Michigan Filed Mar. 27, 1967, Ser. No. 626,254
Int. Cl. G06g *7/18*
U.S. Cl. 328—127 9 Claims

ABSTRACT OF THE DISCLOSURE

Provision of a negative feedback RC network around a Miller integrator, which incorporates an operational amplifier and a capacitor, to cancel out integration errors due to capacitor absorption.

Among the electrical limitations or defects in even the best available computing capacitors are leakage and absorption, or "soakage," both of which cause computational errors when such capacitors are used in ordinary "Miller" integrators. Prior techniques for compensating for such errors are shown in my copending application with Edward O. Gilbert, Ser. No. 574,468 filed Aug. 23, 1966, now U.S. Pat. No. 3,381,230 issued Apr. 30, 1968, and in prior Edward O. Gilbert application Ser. No. 589,747 filed Oct. 26, 1966. In most embodiments of these prior inventions an inverter stage and positive feedback network is employed to compensate for soakage. Those circuits of these two prior inventions are capable of dramatically improving electronic integrator performance, and they may be implemented at very low cost when "bi-polar" operational amplifiers are used. Bipolar operational amplifiers are those provided with an extra inverter stage at their output to make both polarities of each computer quantity available, principally for the purpose of simplifying problem patching. Some alternative embodiments of the mentioned prior cases do not require extra inverter amplifiers but instead provide positive feedback by connecting the compensating network around two inverting stages of the usual three-inversion amplifier. While absorption compensation in such a manner is practical, it undesirably requires connections "inside" the amplifier, and because the gains of the individual inverting stages often are not precisely known and precisely fixed, compensation in such a manner sometimes is difficult to scale and more likely to become misadjusted as transistors and other components age. Because very many presently available computer amplifiers are not "bi-polar," but instead "single-polarity," it becomes desirable to provide integrator compensation for soakage and leakage with an arrangement readily adaptable to amplifiers which provide a single-polarity of output signal. Thus it is a primary object of the present invention to provide a "soakage" compensation circuit by means of a negative feedback circuit rather than a positive feedback circuit, so that the mentioned inverter stage is not required. Prior art Pat. Nos. 2,745,007 and 3,047,808 show soakage compensation schemes which do not utilize positive feedback, but they have other disadvantages. For example, the compensation circuit utilized at the integrator output in Pat. No. 2,745,007 seriously increases integrator output impedance, and the compensation circuit used at the integrator input in Pat. No. 2,745,007 becomes a function of computer problem patching, and must be repeated for each input applied to be summed by an integrator. Thus it is also an object of the present invention to provide soakage compensation without increasing or changing integrator output or input impedances.

Other objects of the invention will in part be obvious and will in part appear hereinafter.

The invention accordingly comprises the features of construction, combinations of elements, and arrangement of parts, which will be exemplified in the constructions hereinafter set forth, and the scope of the invention will be indicated in the claims.

For a fuller understanding of the nature and objects of the invention reference should be had to the following detailed description taken in connection with the accompanying drawings, in which:

FIG. 1 is a simplified electrical schematic diagram, partially in block form, illustrating one embodiment of the invention.

FIG. 2*a* is an equivalent circuit diagram useful in illustrating the actual electrical characteristics of a computing capacitor.

FIG. 2*b* illustrates a single one of the several negative feedback networks used to compensate for capacitor absorption.

Figure 1:
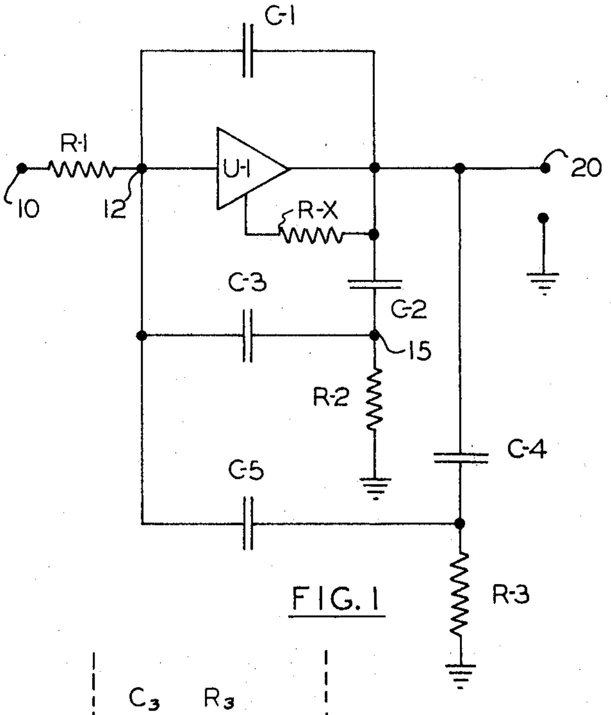
Figure 2A:
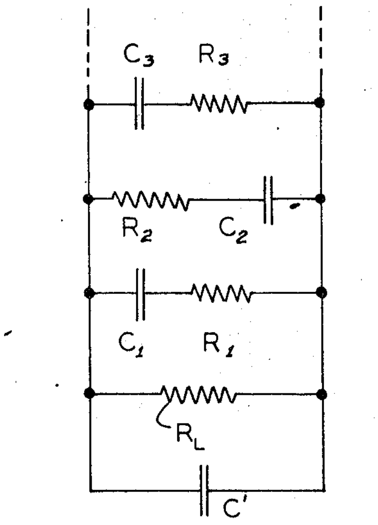

Shown in FIG. 1 are a conventional Miller integrator including input scaling resistance R–1, feedback operational amplifier U–1, and feedback capacitor C–1. If various adjustments are made to the operational amplifier to minimize errors due to voltage offset and current input to the amplifier, the accuracy of integration is limited chiefly by the characteristics of computing capacitor C–1. While capacitor C–1 ideally would comprise pure capacitance, any actual capacitor includes a number of electrical limitations, so that a more accurate indication of an actual capacitor is given by the equivalent circuit of FIG. 2*a*. In FIG. 2*a* capacitor C′ represents the ideal or pure capacitance portion of the actual capacitor, resistance $R_L$ represents the leakage resistance of the actual capacitor, and a plurality of series RC circuits $R_1C_1$, $R_2C_2$, $R_3C_3$, etc. represent the absorption characteristics of the actual capacitor. A typical high-quality presently available computing capacitor of 1.0 microfarad capacity might have a leakage resistance of $5\times10^{12}$ ohms.

A number of techniques for experimentally determining equivalent networks to represent capacitor absorption are known and need not be set forth in detail herein. Ordinarily three to five series RC networks are necessary to represent absorption effects over an appreciable frequency range, the number and the frequency spacing thereof depending solely upon the extent of the frequency range over which one wishes to compensate for asborption effects. In general purpose analog computer integrators, for example, compensation of the range of .016 to 8 hertz is usually deemed necessary. Much different frequency ranges may be deemed more important in various other applications.

In accordance with the present invention as shown in FIG. 1, a first negative feedback resistance-capacitance network comprising resistor R–2, capacitor C–2, and capacitor C–3 is provided to compensate for the $R_1C_1$ branch of the equivalent circuit, a second negative feedback circuit comprising resistor R–3, capacitor C–4 and capacitor C–5 is provided to compensate for the $R_2C_2$ branch of the equivalent circuit, and as many additional networks (not shown) of a similar nature as desired may be used to cancel out the soakage represented by further branches of the capacitor equivalent circuit. As will become clear below, each negative feedback compensation network (such as R–2, C–2, C–3) cancels out only the resistive portion (such as $R_1$) of its associated branch of the equivalent network and leaves the parallel capacitive portion, in effect adding it to the pure capacitance C′ of the main capacitor C–1.

Figure 3:
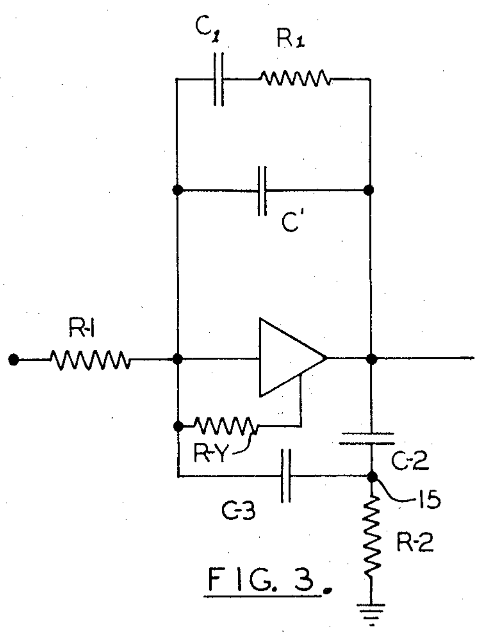
FIG. 3 is an equivalent circuit of the integrator of FIG. 1 with one compensating network added in accordance with the present invention.

FIG. 3 will be seen to show the equivalent circuit of the integrator of FIG. 1 with a single compensating feedback network (C–2, C–3, R–2), and with the leakage resistance $R_L$ of the main computing capacitor omitted. The total admittance $Y_t$ of the three negative feedback paths of FIG. 3 in parallel will be seen to equal the sum of the three individual admittances.

The impedance of the pure capacitance C′ in FIG. 2*a* will be seen to equal $1/sC'$, where $s$ is the complex operator.

The impedance of the $R_1C_1$ resistance-capacitance branch representing one absorption term will be seen to equal $$R_1+\frac{1}{sC_1}\text{ or }\frac{R_1C_1s+1}{sC_1}$$

and the admittance of that branch to equal $$\frac{sC_1}{R_1C_1s+1}$$

Figure 2B:
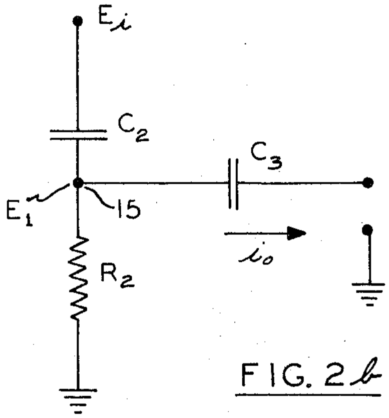

Referring now to FIG. 2*b*, the voltage $E_1$ at terminal 15 of the voltage divider formed by $C_2$ and $R_2$ may be expressed as follows:

$$E_1=E_i\frac{Z_B}{Z_A+Z_B}\qquad(1)$$

where $Z_B$, the impedance of $R_2$ and $C_3$ in parallel equals the product of their impedances over the sum of their impedances, or $$Z_B=\frac{R_2\frac{1}{sC_3}}{R_2+\frac{1}{sC_3}}\text{ or }\frac{R_2}{R_2C_3s+1}\qquad(2)$$

and $Z_A$ is the impedance of $C_2$, or $1/sC_2$.

The voltage $E_1$ at terminal 15 thus may be seen to equal $$\frac{\frac{R_2}{R_2C_3s+1}}{\frac{R_2}{R_2C_3s+1}+\frac{1}{sC_2}}E_i=\frac{R_2C_2s}{R_2(C_2+C_3)+1}E_i\qquad(3)$$

The current $i_0$ through capacitor $C_3$ will be seen to equal:

$$i_o=C_3sE_1$$

assuming that terminal 12, the amplifier summing junction, is effectively at ground potential, which is usual in the case of high-gain, direct-coupled feedback amplifiers.

Substituting the expression for $E_1$ in the above:

$$i_o=C_3s\left[\frac{R_2C_2s}{R_2(C_2+C_3)+1}E_i\right]=\frac{R_2C_2C_3s^2E_i}{R_2(C_2+C_3)s+1}\qquad(4)$$

The impedance of the C–2, C–3, R–2 network will be seen to equal $E_i/i_o$, and the admittance of the network to equal $i_o/E_i$, or $$\frac{R_2C_2C_3s^2}{R_2(C_2+C_3)s+1}$$

If the resistances and capacitances in such an expression are replaced by constants, it will be seen that the basic transfer function of the network takes the form:

$$\frac{k_1s^2}{k_2s+k_3}$$

Now, adding the admittances of the three separate feedback paths in FIG. 3 to obtain a total admittance:

$$Y_t=sC'+\frac{sC_1}{R_1C_1s+1}+\frac{R_2C_2C_3s^2}{R_2(C_2+C_3)s+1}\qquad(5)$$

Now, it may be demonstrated (1) that if the values $C_2$ and $C_3$ of the network are chosen so that $$\frac{C_2C_3}{C_2+C_3}=C_1\qquad(6)$$

and (2), that if the three values in the R–3, C–2, C–3 network are chosen so that $$R_3(C_2+C_3)=R_1C_1\qquad(7)$$

the total feedback admittance $Y_t$ then will reduce to $$Y_t=sC'+\frac{sC_2C_3}{C_2+C_3}=s(C'+C_1)\qquad(8)$$

Inspection of expression (8) now readily reveals that the addition of the R–2, C–2, C–3 network has cancelled out the effects of resistance $R_1$ in FIG. 3, so that the only remaining effect of the absorption represented in FIG. 3 is to add to or increase the value of the main computing capacitor. As will be readily apparent, the integrator time-constant in FIG. 3 will be determined by R–1 and a capacitance of $[C'+C_1]$. The capacitance represented by $C'$ may include a trimming capacitor, of course, to allow the total capacitance $C'+C_1$ to be adjusted to a desired value.

Additional networks, such as R–3, C–4, C–5 of FIG. 1 may be added to compensate for further absorption terms, such as that represented by $R_2$ and $C_2$ in FIG. 2*a*, using the relationship of expressions (6) and (7) to determine the values for resistor R–3 and capacitors C–4 and C–5. Such a further compensation network will, of course, add an even further amount ($C_2$) of capacitance to the integrating time-constant. As mentioned above, as many as three to five compensating networks may be desired in typical applications in order to cancel out absorption over a substantial frequency range.

It will be seen that the negative feedback compensation networks of the present invention, unlike the positive feedback networks for the prior Gilbert-Single and Gilbert applications, do not correct in any way for capacitor leakage and error due to amplifier finite gain. In order to overcome those integrator limitations without requiring an extra inverter stage, one may provide a purely resistive positive feedback network, such as is indicated at R–X in FIG. 1, wherein feedback resistance R–X is deemed to be connected between the amplifier output terminal 20 and the positive or rebalancing, second input line of the differential stage usually forming the first stage of operational amplifier U–1. That input line of the differential amplifier is frequently readily available, of course, because the output of an associated stabilizer channel frequently must be connected to it. An alternative positive feedback connection suitable for compensating for leakage and amplifier gain limitations is shown at R–Y in FIG. 3, with one end of feedback resistance R–Y connected to the integrator summing junction 12 and the other end connected to the output of the second inverting stage within the amplifier.

Figure 4:
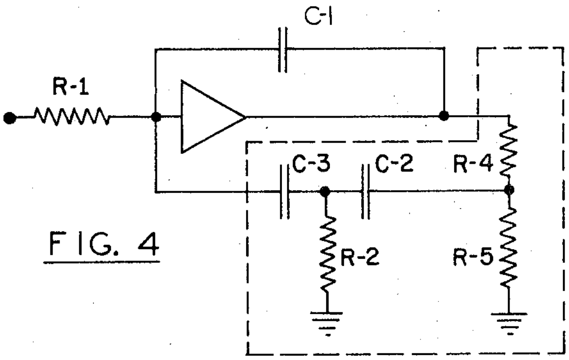
FIGS. 4 and 5 are schematic diagrams illustrating alternative forms of absorption-compensation negative feedback networks.
Figure 5:
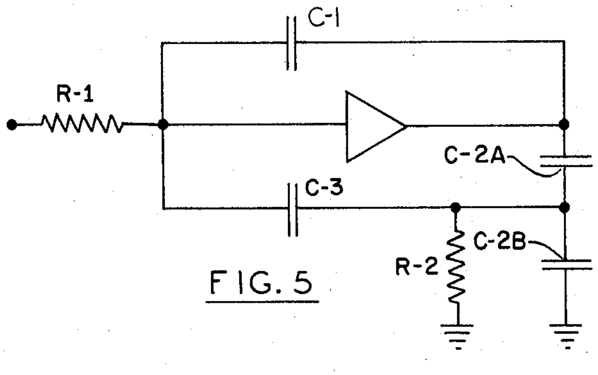

It is important to note that exact and total compensation of capacitor absorption errors is no necessary for substantial improvement in integrator operation. While feedback networks of the type shown in FIG. 1 may be tailored to provide exact cancellation, various other networks having comparable transfer functions may be substituted to considerably reduce but not wholly cancel absorption errors. One alternative type of feedback network which allows utilization of more readily-available components is shown within dashed lines in FIG. 4. The network of FIG. 4 closely approximates the exact network of FIGS. 1 and 3 if the value of R–5 in FIG. 4 is very small. Another network which may be tailored to exactly compensate for absorption is shown in FIG. 5. While such a network can be tailored to provide exact and complete cancellation of absorption errors, it has the disadvantage that it applies a capacitive load to the amplifier, which sometimes disadvantageously affects stability of the amplifier. In FIG. 4 the amplifier output will be seen to be diminished by the voltage divider formed by R–4 and R–5, so that components having greater admittance may be used at C–2, C–3 and R–2 to provide the proper feedback current, while FIG. 5 uses a capacitive voltage divider C–2A, C–2B to function generally similarly. A variety of alternative negative feedback networks having transfer functions approximately those of the networks shown will become readily apparent to those skilled in the art as a result of this disclosure. One common characteristic of all useful negative feedback compensation networks utilized in accordance with the present invention will be the fact that such networks will not provide a D.C. path between the output and input terminals of the amplifier.

It will thus be seen that the objects set forth above, among those made apparent from the preceding description, are efficiently attained, and since certain changes may be made in the above constructions without departing from the scope of the invention, it is intended that all matter contained in the above description or shown in the accompanying drawing shall be interpreted as illustrative and not in a limiting sense.

The embodiments of the invention in which an exclusive property or privilege is claimed are defined as follows:

1. An electronic integrator circuit, comprising, in combination: an electronic amplifier having an input terminal; an output terminal; a plurality of amplifier stages collectively providing polarity inversion between said terminals; a first capacitor having a first capacity with an absorption characteristic connected between said terminals; and a negative feedback resistance-capacitance network connected between said terminals to cancel out the effect of a portion of said absorption characteristic.

2. A circuit according to claim 1 in which said negative feedback network includes a second capacitance and resistor connected in series between said output terminal and a reference level, and a third capacitance connected from the junction between said second capacitance and said resistor to said input terminal.

3. A circuit according to claim 1 in which said network includes a plurality of branches, each of said branches comprising a second capacitance and a resistor connected in series between said output terminal and a reference level and a third capacitance connected from the junction between said second capacitance and said resistor to said input terminal.

4. A circuit according to claim 2 in which the admittance of said network is equal to $$\frac{R_2C_2C_3s^2}{R_2(C_2+C_3)s+1}$$

in which $$\frac{C_2C_3}{C_2+C_3}=C_1$$

and in which $$R_3(C_2+C_3=R_1C_1$$

wherein said absorption characteristic is represented by a series RC circuit having a resistance $R_1$ and a capacitance $C_1$, $C_2$ and $C_3$ are the capacitance values of said second and third capacitances, respectively, and $R_2$ is the resistance value of said resistor.

5. A circuit according to claim 1 in which said negative feedback network includes a voltage divider connected between said output terminal and a reference level, a second capacitance and a resistance connected in series between a point on said voltage divider and said reference level, and a third capacitance connected between said input terminal and the junction between said second capacitance and said resistance.

6. A circuit according to claim 1 in which said negative feedback network comprises second and third capacitances connected in series between said output terminal and a reference level, a resistance connected between the junction between said second and third capacitances and said reference level, and a fourth capacitance connected between said junction and said input terminal.

7. A circuit according to claim 1 in which said negative feedback network has a transfer function of the form $$\frac{k_1s^2}{k_2s+k_3}$$

where $s$ is the differential operator.

8. A circuit according to claim 1 having a resistance connected between said output terminal and the input circuit of one of said amplifier stages to provide positive feedback to said one of said amplifier stages.

9. A circuit according to claim 1 having a resistance connected between said input terminal and the output circuit of one of said amplifier stages to provide positive feedback from said one of said amplifier stages to said input terminal.

References Cited

UNITED STATES PATENTS 3,381,230 4/1968 Gilbert et al. -------- 328—127

FOREIGN PATENTS 237,937 1/1965 Austria.
864,963 4/1961 Great Britain.
1,216,827 11/1959 France.
1,288,633 2/1962 France.

DONALD D. FORRER, Primary Examiner
S. T. KRAWCZEWICZ, Assistant Examiner

U.S. Cl. X.R.

330—76